United States Patent [19]

Thornton

[11] Patent Number: 4,731,789
[45] Date of Patent: Mar. 15, 1988

[54] CLAD SUPERLATTICE SEMICONDUCTOR LASER

[75] Inventor: Robert L. Thornton, East Palo Alto, Calif.

[73] Assignee: Xerox Corporation, Stamford, Conn.

[21] Appl. No.: 733,357

[22] Filed: May 13, 1985

[51] Int. Cl.$^4$ .................... H01S 3/19; H01L 27/12
[52] U.S. Cl. .................................. 372/45; 357/4; 357/17; 372/46
[58] Field of Search ..................... 372/44, 45, 46; 357/45 L, 4; 351/17

[56] References Cited

U.S. PATENT DOCUMENTS 4,184,171 1/1980 Panish .............................. 372/45
4,378,255 3/1983 Holonyak, Jr. et al. ............ 148/1.5

OTHER PUBLICATIONS

T. Fukuzawa et al., "GaAlAs Buried Multiquantum Well... Disordering", APL, vol. 45(1), pp. 1-3 (Jul. 1, 1984).
W. D. Laidig et al., "Embedded-Mirror Semiconductor Laser", APL, vol. 45(5), pp. 485-487 (Sep. 1, 1984).
W. D. Laidig et al., "Disorder of an AlAs-GaAs Superlattice by Impurity Diffusion", APL, vol. 38(1), pp. 776-778 (May 15, 1981).
W. D. Laidig et al., "Induced Disorder of AlAs-Al-GaAs-GaAs Quantum-Well Heterostructures", Journal of Electronic Materials, vol. 11(1), pp. 1-20 (1982).
J. P. Leburton et al., "Index of Refraction of AlAs--GaAs Superlattices", Journal of Applied Physics, vol. 54(7), pp. 4230-4231 (Jul. 1983).

Primary Examiner—James W. Davie
Assistant Examiner—Georgia Y. Epps
Attorney, Agent, or Firm—W. Douglas Carothers, Jr.

[57] ABSTRACT

A clad superlattice semiconductor laser is fabricated utilizing Impurity Induced Disordering (IID) techniques that provides (1) reduction of free carrier absorption in the optical cavity and (2) the ability to selectively vary the amount of index guiding in the optical waveguide independent of the properties of the electron confining multiquantum well structure. The clad superlattice semiconductor laser provides for the novel inclusion of a superlattice in a cladding layer or region of the laser structure. An effective index waveguide can be realized by selectively disordering the cladding superlattice in regions adjacent to the formed index guide type optical cavity, as long as the superlattice is designed so that the established optical mode significantly overlaps with the disordered superlattice cladding regions, i.e., the evanescent wave propagating in the laser cavity overlaps into regions of the disordered superlattice.

20 Claims, 4 Drawing Figures

CLAD SUPERLATTICE SEMICONDUCTOR LASER

BACKGROUND OF THE INVENTION

This invention relates to semiconductor lasers and, in particular, to buried heterostructure semiconductor lasers utilizing Impurity Induced Disordering (IID).

Recently, advances have been made in the art to better delineate the bandgap and refractive indices properties in a single semiconductor device by impurity induced disordering (IID) where zinc is selectively diffused into the multiquantum well structure thereby disordering quantum well structures epitaxially deposited as part of a semiconductor device. An example of IID is U.S. Pat. No. 4,378,255 to Holonyak wherein there is taught the technique of selectively disordering a multiple quantum well structure or superlattice in a semiconductor device through the employment of a zinc diffusion causing an upward shifting of the bandgap of the disordered material compared to regions of the multiple quantum well structure where disordering has not occurred. Such diffusions can be generally carried out in a temperature range of 500° C.-600° C., which is lower than the epigrowth temperature of III-V materials, which is about 750° C.

Such disordering is also possible with other elements such as Si, Ge and Sn but at higher temperatures, e.g., about 675° C.

Also, disordering is possible through implantation of elements acting as shallow or deep level impurities, such as, Se, Mg, Sn, O, S, Be, Te, Si, Mn, Zn, Cd, Ln, Cr or Kr followed by a high temperature anneal best performed in an As environment in the case of III-V epigrowth to prevent the outdiffusion of As from the growth. In the case of impurity implant followed by an anneal, the anneal temperatures are relatively at higher temperatures compared to diffusion temperatures, e.g., above 800° C.

Teachings relative to smearing or disordering of multiquantum wells in heterostructure lasers lowering the refractive index in disordered regions can be found in the following references: W. D. Laidig et al, "Disorder of an AlAs-GaAs Superlattice by Impurity Diffusions", Applied Physics Letters, Vol. 38(1), pp. 776-778, (May 15, 1981); W. D. Laidig et al, "Induced Disorder of AlAs-AlGaAs-GaAs Quantum Well Heterostructures", Journal of Electronic Materials, Vol. 11(1), pp. 1-20 (1982); J. P. Leburton et al, "Index of Refraction of AlAs-GaAs Superlattices", Journal of Applied Physics, Vol. 54(7), pp. 4230-4231 (July, 1983).

Recently, there has been proposed a buried heterostructure semiconductor laser of the GaAs/GaAlAs regime and referred to as transverse mode controlled laser having a buried multiquantum well (BMQW). In order to bury the multiquantum well active region, impurity induced disordering (IID) where zinc is selectively diffused into the multiquantum well structure comprising the active region. This diffusion through the active region adjacent both sides of a mask protected region formed a buried multiquantum well active region surrounded on adjacent sides by a zinc diffused region which smeared out the multiquantum well integrity of the regions of the active layer. Zinc diffusion at a relatively low temperature promotes the intermixing of Al and Ga in a GaAs/GaAlAs superlattice making up the active region which results in the formation at these diffused active regions of a GaAlAs alloy with an averaged AlAs mole fraction. Due to the disordering, the buried multiquantum well active region has a refractive index larger than the adjacent averaged GaAlAs alloy regions so that this refractive index difference enables the formation of an optical waveguide. The disordered regions provide a barrier for confining the injected electrons and holes to the active region. The benefits can be realized by a single diffusion step, eliminating the two step fabricating process, for example, used in the past to fabricate buried heterostructure lasers. The basis for the above-outlined proposal can be found in the article of T. Fukuzawa et al entitled "GaAlAs Buried Multiquantum Well Lasers Fabricated by Diffusion Induced Disordering", Applied Physics Letters, Vol. 45(1), pp. 1-3, (July 1, 1984).

There are, however, certain drawbacks to the buried heterostructure proposed by Fukuzawa et al. The disordering of the multiquantum wells requires diffusion across or through the laser active regions to be disordered thereby creating problems relative to free carrier absorption in the optical cavity of the multiquantum well active region and, further, the resultant refractive index changes in diffused regions of the active region may be too large for stable single mode operation up to desired power levels.

SUMMARY OF THE INVENTION

According to this invention, a clad superlattice semiconductor laser is fabricated utilizing IID techniques that provides (1) reduction of free carrier absorption in the optical cavity and (2) the ability to selectively vary the amount of index guiding in the optical waveguide independent of the properties of the electron confining multiquantum well structure. The clad superlattice semiconductor laser comprising this invention provides for the novel inclusion of a superlattice in a cladding layer or region of the laser structure. An effective index waveguide can be realized by selectively disordering the cladding superlattice in regions adjacent to the formed index guide type optical cavity, as long as the superlattice is designed so that the established optical mode significantly overlaps with the disordered superlattice cladding regions, i.e., the evanescent wave propagating in the laser cavity overlaps into regions of the disordered superlattice.

The clad superlattice may be formed on either side of the active region or two clad superlattices may be utilized in combination, one on either side of the active region.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
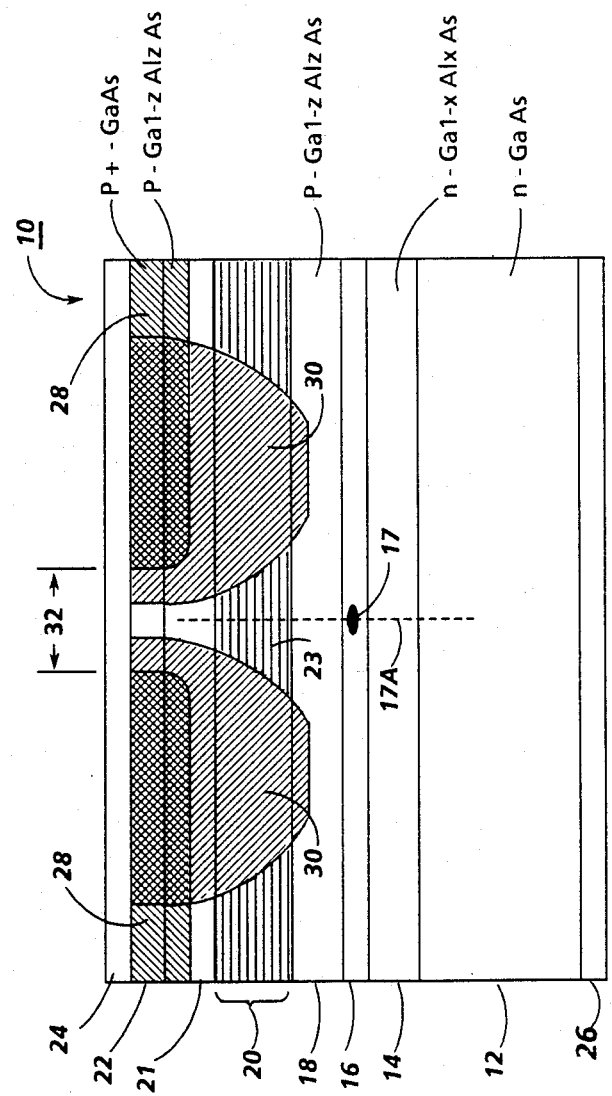
FIG. 1 is a diagrammatic side illustration of a clad superlattice semiconductor laser comprising this invention. Semiconductor layers in the illustration are not shown in proper scale for purposes of illustration.

Reference is made to FIG. 1 wherein there is shown the clad superlattice semiconductor laser 10 comprising this invention. Laser 10 comprises a substrate 12 of, for example, n-GaAs, upon which are epitaxially deposited a cladding layer 14 of n-Ga$_{1-x}$Al$_x$As; an active region 16, being nondoped, or p-type or n-type and which may comprise a GaAs active layer or a single quantum well, such as GaAs or Ga$_{1-y}$Al$_y$As where y is very low, or a multiple quantum well superlattice such as, alternating layers of GaAs and AlAs or alternating layers of GaAs and Ga$_{1-y}$Al$_y$As where y is very low or alternating layers of Ga$_{1-w}$Al$_w$As and Ga$_{1-B}$Al$_B$As where w is very low; an inner cladding layer 18 of p-Ga$_{1-z}$Al$_z$As; a p-type cladding superlattice 20 which may comprise alternating layer of GaAs and AlAs or alternating layers of GaAs and Ga$_{1-y}$Al$_y$As where y is very low or alternating layers of Ga$_{1-w}$Al$_w$As and Ga$_{1-B}$Al$_B$As where w is very low; an outer cladding layer 21 of p-Ga$_{1-x}$Al$_x$As and a cap layer 22 of p+-GaAs.

As is known in the art, the epitaxial growth of laser 10 may be carried out by molecular beam epitaxy (MBE) or metalorganic chemical vapor deposition (MOCVD). The clad superlattice 20 may be composed, for example, of several 40 Å thick GaAs wells separated by 60 Å thick Ga$_{1-y}$Al$_y$As barriers where y may, for example, be in the range of 0.1 to 0.4. Cladding layer 14 may have a thickness in the range of 0.1 to 1 μm. Active region 16 may have a range of thickness between 0.01 to 0.1 μm depending upon the type of region. For example, active region may comprise a multiquantum well superlattice composed of several 60 Å thick GaAs wells separated by several 120 Å thick barriers of Ga$_{0.7}$Al$_{0.3}$As so that the total region thickness is about 0.08 μm. Cladding layers 18 and 21 may each have a thickness in the range of 0.01 to 0.5 μm. Superlattice 20 may have a range of thickness of 0.1 to 1 μm. Cap layer 22 is an ohmic contact layer and may have a thickness in the range of 0.1 to 1 μm.

It should be noted that in the illustration of FIG. 1, superlattice 20 is shown out of proportion relative to other adjacent semiconductor layers for the purpose of structural clarity.

There are alternate conventional techniques and diffusion/implant species for carrying out the desired disordering, e.g. Si or Sn diffusion or the elemental implant/annealing technique as discussed previously. Discussion hereafter will be confined to Zn IID. However, it should be noted that these other techniques and elemental diffusions or implants are equally applicable.

Upon the completion of epitaxial growth, a Si$_3$N$_4$ mask is prepared on cap layer 22 to delineate an optical waveguide region for laser 10 and leaving adjacent surfaces of layer 22 exposed. Next, using IID techniques, a zinc diffusion is carried out through exposed layer 22 surfaces at a relatively low temperature, e.g., 600° C.-700° C. in an evacuated heater, such as a silica ampoule. This diffusion causes an intermixing of Al and Ga in the superlattice 20 resulting in a GaAlAs alloy with an averaged AlAs mole fraction throughout its thickness in the regions of diffusion. The diffusion is extended through superlattice 20 in the exposed regions on either side of the mask to penetrate into cladding layer 18 forming the diffused regions indicated in FIG. 1 by cross-hatched lines, which regions include the disordered regions 30 of superlattice 20. As the rate of Zn diffusion in superlattice 20 is significantly faster than in GaAlAs when the AlAs mole fraction in cladding layer 18 is low, the relatively lower Al layer 18 serves as a barrier to the Zn diffusion, making it easier to stop the Zn diffusion before reaching active region 16. Disordered regions 30 in the area of superlattice 20 will have a lower refractive index than waveguide region 23 of superlattice 20 due to the Al and Ga disordering. The difference in refractive index enables the formation of an index guided structure in what started as a planar gain guided structure. Thus, the incorporation of IID regions 30 eliminate the need of forming nonplanar structures on substrate 12 prior to epitaxial growth to form index guide type lasers.

Next, the Si$_3$N$_4$ mask is removed. To provide a more defined current confinement region to the region of optical waveguide cavity 17A, a proton implant 28 is performed which defines the width of stripe 32. In lieu of a proton implant, alternatively an oxide stripe may be formed, as is well known in the art. Stripe 32 may be 2 μm to 10 μm in width. The stripe 32 and implants 28 function as a current confinement means to restrict current flow more to the region of optical cavity 17A and p-n junction at the interface of cladding layer 18 and active region 16. The surface of cap layer 22 is provided with a conventional metal contact layer 24 while the bottom surface of substrate 12 is provided with a conventional metal contact 26. As just indicated, proton implants 28 provide insulating regions to restrict current flow to the region of stripe 32 when a voltage is applied across contacts 24 and 26 producing lasing emission at point 17 in active region 16.

As suggested in the previously cited art, it is known that zinc diffusion is capable of disordering quantum wells in GaAlAs multiple quantum well lasers. The resulting average composition alloy has been shown to have a refractive index which is somewhat lower than the refractive index of an undisturbed multiple quantum well structure. As disclosed in Fukuzawa et al, IID may produce an index guided laser by performing a zinc diffusion through the active region of the laser on both sides of the actual lasing region. This technique has the disadvantage, however, of creating a higher free carrier absorption in the highly doped p regions of the Fukazawa et al laser, which will also contribute to free carrier absorption and decrease device efficiency. To eliminate or substantially reduce these problems, the IID regions 30 are not diffused for a time period that would cause their extension into and through the active region 16. Since the zinc diffusion does not penetrate and cross active region 16, the effect of free carrier absorption is reduced.

Also, the novel inclusion of superlattice 20 in the upper cladding layers combined with IID techniques provides an enhanced means for forming an index optical waveguide in the region of optical cavity 17A. The resulting structure provides a strong index guide via optical coupling to superlattice region 23 from active region 16 through cladding layer 18. The strength of this coupling can be varied by altering the thickness and composition of cladding layer 18 during growth.

The strength of the waveguide of cavity 17A can be varied independently of active region parameters by varying the composition and the thickness of the layers in superlattice 20 and, hence, the refractive index change between ordered region and disordered regions 30. These combined design techniques of compositional change in region 30 and thickness variation of cladding layer 18 allow the effective change in refractive index to be kept sufficiently small so that single mode operation of laser 10 can be achieved to desired power levels within designed waveguide width tolerances.

Figure 2:
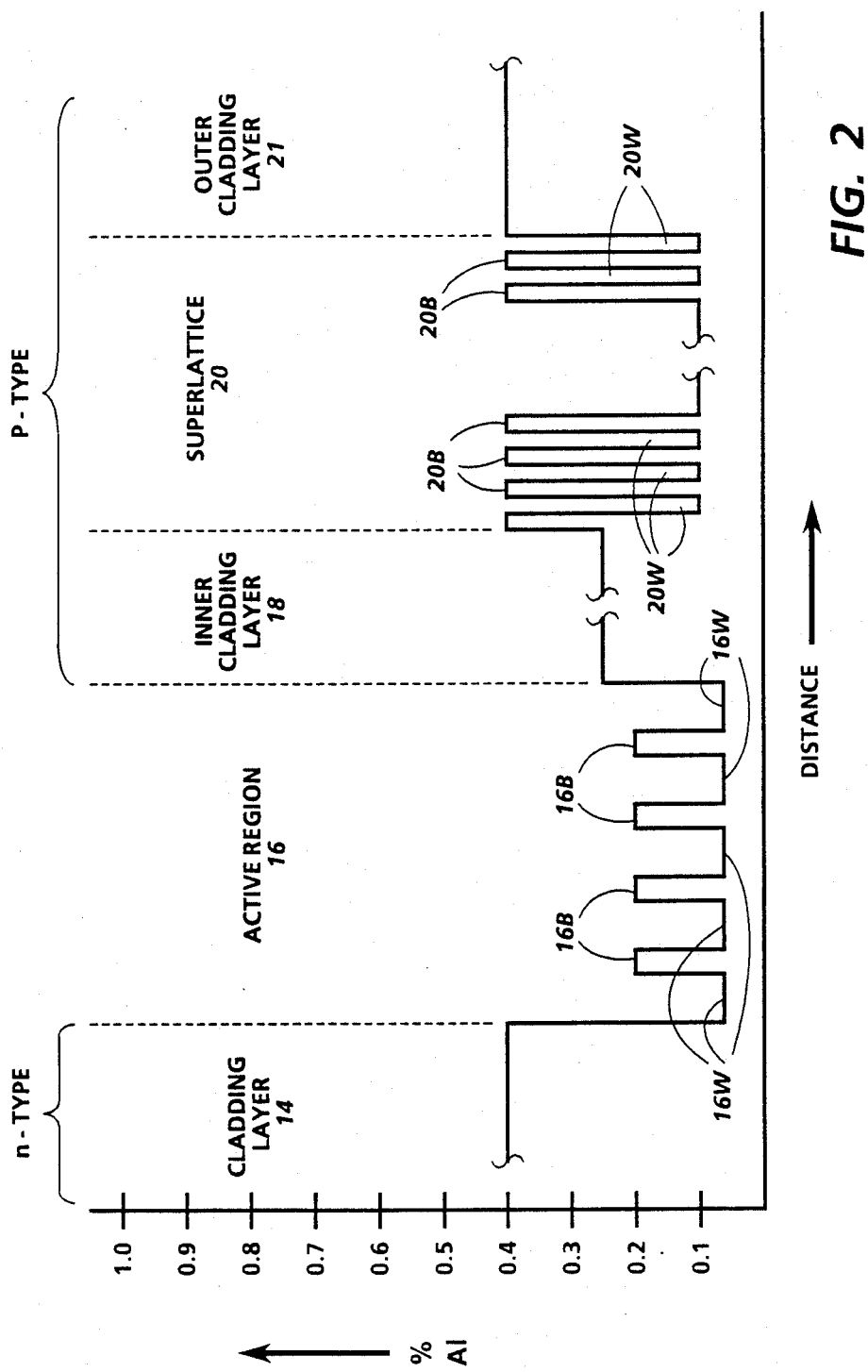
FIG. 2 is an illustration of a composition profile for the laser shown in FIG. 1.

FIG. 2 illustrates a compositional profile for a laser 10. As shown in FIG. 2, cladding layer 14 comprises n-$Ga_{1-x}Al_xAs$ where x equals 0.4. Active region 16 comprises five wells 16W of $Ga_{1-w}Al_wAs$ where w equals 0.07 separated by four barriers 16B of $Ga_{1-B}Al_BAs$ where B equals 0.2. Inner cladding layer 18 is provided with low Al content to permit optical coupling to superlattice 20 and serves as a confining barrier to carriers in active region 16. Inner cladding layer 18, for example, comprises p-$Ga_{1-z}Al_zAs$ where z equals 0.25. Superlattice 20 comprises a plurality of alternating layers of $Ga_{1-w}Al_wAs$ (layers 20W) where w equals 0.1 and $Ga_{1-B}Al_BAs$ (layers 20B) where B equals 0.4. There may be, for example, as many as 40 to 100 wells 20W and barriers 20B. Outer cladding layer 21, for example, comprises p-$Ga_{1-x}Al_xAs$ where x equals 0.4 and is followed by cap layer 22 of p+-GaAs.

Figure 3:
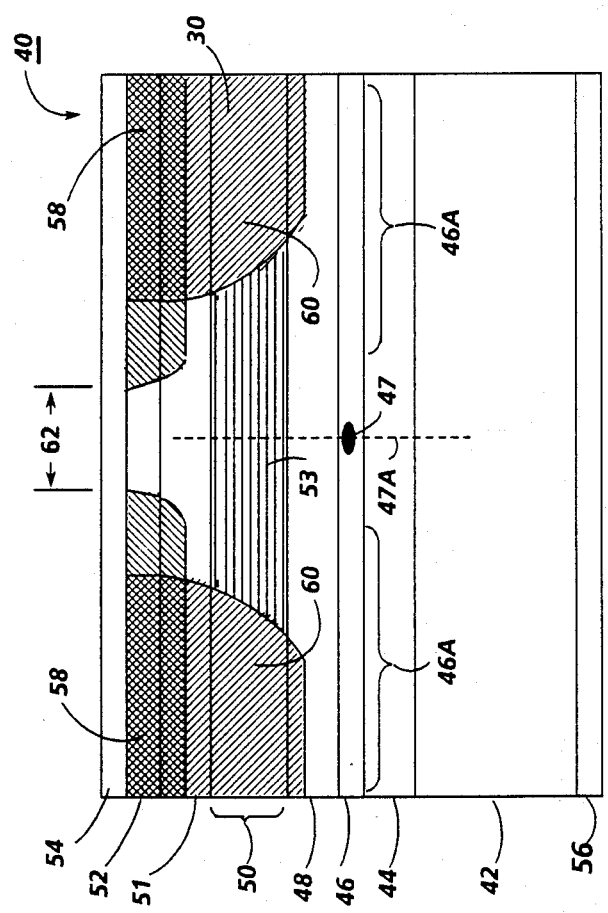
FIG. 3 is a diagrammatic side illustration of a clad superlattice semiconductor laser comprising this invention. Semiconductor layers in the illustration are not shown in proper scale for purposes of illustration.

Reference is now made to FIG. 3 wherein there is shown the clad superlattice semiconductor laser 40 comprising this invention. Laser 40 comprises a substrate 42 of, for example, n-GaAs, upon which are epitaxially deposited a cladding layer 44 of n-$Ga_{1-x}Al_xAs$; an active region 46, being nondoped, or p-type or n-type and which may comprise a GaAs active layer or a single quantum well, such as GaAs or $Ga_{1-y}Al_yAs$ where y is very low, or a multiple quantum well superlattice such as, alternate layers of GaAs and AlAs or alternating layers of GaAs and $Ga_{1-y}Al_yAs$ where y is very low or alternating layers of $Ga_{1-w}Al_wAs$ and $Ga_{1-B}Al_BAs$ where w is very low; a cladding layer 48 of p-$Ga_{1-z}Al_zAs$; a p-type cladding superlattice 50 which may comprise alternating layers of GaAs and AlAs or alternating layers of GaAs and $Ga_{1-y}Al_yAs$ where y is very low or alternating layers of $Ga_{1-w}Al_wAs$ and $Ga_{1-B}Al_BAs$ where w is very low and a cap layer 52 of p+-GaAs.

Clad superlattice 50 may be composed, for example, of several 40 Å thick GaAs wells separated by 60 Å thick $Ga_{1-y}Al_yAs$ barriers where y may, for example, be in the range of 0.1 to 0.4. Cladding layer 44 may have a thickness in the range of 0.1 to 1 μm. Active region 46 may have a range of thickness between 0.01 and 0.1 μm depending upon the type of region. For example, active region may comprise a multiquantum well superlattice composed of several 60 Å thick GaAs wells separated by several 120 Å thick barriers of $Ga_{0.7}Al_{0.3}As$ so that the total region thickness is about 0.08 μm. Cladding layer 48 may have a thickness in the range of 0.01 to 0.5 μm. Superlattice 50 may have a range of thickness of 0.1 to 1 μm. Cap layer 52 is an ohmic contact layer and may have a thickness in the range of 0.1 to 1 μm.

As in the case of FIG. 1, superlattice 50 of FIG. 3 is shown out of proportion relative to other adjacent semiconductor layers fo the purpose of structural clarity. Also to be noted is that laser 40 does not have an outer cladding layer like laser 10.

Upon the completion of epitaxial growth, a $Si_3N_4$ mask is prepared on cap layer 52 to delineate an optical waveguide region for laser 40, leaving adjacent surfaces of layer 52 exposed. Next, using IID techniques, a zinc diffusion is carried out through exposed layer 52 surfaces at a relatively low temperature, e.g., 700° C. in an evacuated heater such as a silica ampoule. This diffusion causes an intermixing of Al and Ga in the superlattice 50 resulting in a GaAlAs alloy with an averaged AlAs mole fraction throughout its thickness in the disordered regions. The diffusion is extended through superlattice 50 in the exposed regions on either side of the mask to penetrate into cladding layer 48 forming the diffused regions indicated in FIG. 3 by cross-hatched lines, which regions including disordered regions 60 of superlattice 50. Disordered regions 60 in the area of superlattice 50 will have a lower refractive index than waveguide region 53 of superlattice 50 due to the Al and Ga disordering. The difference in refractive index enables the formation of an index guided structure in what started as a planar gain guided structure. Thus, the incorporation of IID regions 60 eliminate the need of forming nonplanar structures on substrate 42 prior to exitaxial growth to form index guide type lasers.

Next, the $Si_3N_4$ mask is removed. To provide for current confinement region to the region of optical cavity 47A, a proton implant 58 is performed which defines the width of stripe 62. Stripe 62 may be 2 μm to 10 μm in width. The stripe 62 and implants 58 function as a current confinement means to restrict current flow more to the region of optical cavity 47A and p-n junction at the interface of cladding layer 48 and active region 46. The surface of cap layer 52 is provided with a conventional metal contact layer 54 while the bottom surface of substrate 42 is provided with a conventional metal contact 56. As just indicated, proton implants 58 provide insulating regions to restrict current flow to the region of stripe 62 when a voltage is applied across contacts 54 and 56 producing lasing emission at point 47 in active region 46.

Laser 40 differs from laser 10 in FIG. 1 in that the implant regions 58 overlap the diffusion regions 60 whereas in FIG. 1 the diffusion regions 30 overlap the implant regions 28. The structure in FIG. 1 will tend to have more current spreading, but less series resistance, than the structure in FIG. 3, and may prove to be optimal for required higher power devices.

As previously indicated relative to FIG. 1, the novel inclusion of superlattice 50 in the upper cladding layers combined with IID techniques provides an enhanced means for forming an index optical waveguide in the region of optical cavity 47A. The resulting structure provides a strong index guide via optical coupling to superlattice region 53 from active region 46 through cladding layer 48. The strength of this coupling can be varied by altering the thickness and composition of cladding layer 48 during growth.

The strength of the waveguide of cavity 47A can be varied independently of active region parameters by varying the composition and the thickness of the layers in superlattice 50 and, hence, the refractive index change between ordered region 53 and disordered regions 60. These combined design techniques of compositional change in region 60 and thickness variation of cladding layer 48 allow the effective change in refractive index to be kept sufficiently small so that single mode operation of laser 40 can be achieved to desired power levels within designed waveguide width tolerances.

Figure 4:
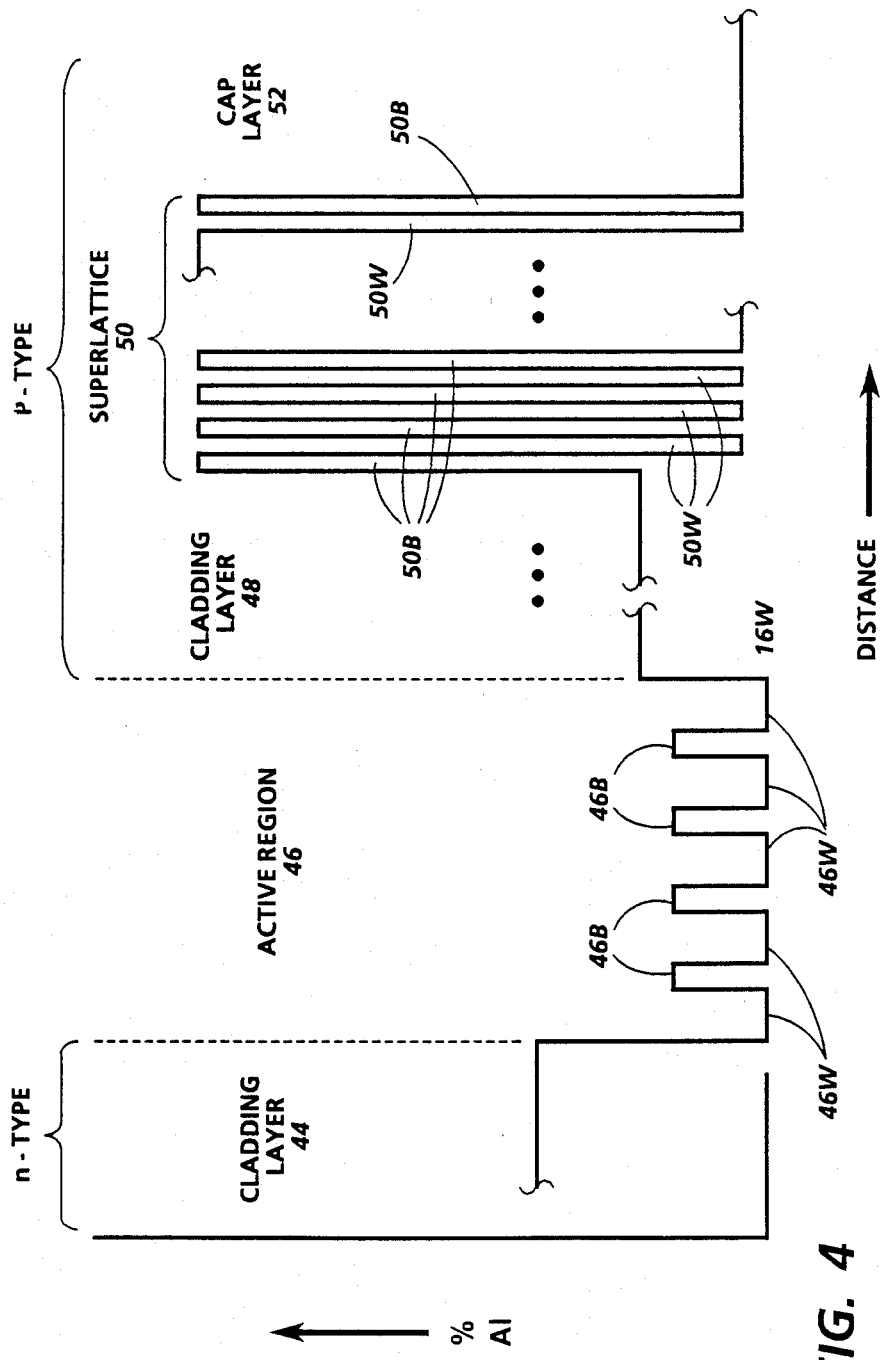
FIG. 4 is an illustration of a composition profile for the laser shown in FIG. 3.

FIG. 4 illustrates a compositional profile for a laser 40. As shown in FIG. 4, cladding layer 44 may comprise n-$Ga_{1-x}Al_xAs$. Active region 46 may comprise five wells 46W of GaAs separated by four barriers 46B of $Ga_{1-y}Al_yAs$. Cladding layer 48 is provided with low Al content to permit optical coupling to superlattice 50 and serves as a confining barrier to carriers in active region 46. Cladding layer 48 may, for example, comprise p-$Ga_{1-z}Al_zAs$. Superlattice 50 may comprise a plurality of alternating layers of GaAs (layers 50W) and AlAs (layers 50B). There may be, for example, as many as 40 to several hundred wells 50W and barriers 50B. Superlattice 50 is followed by cap layer 52 of p+-GaAs.

While the invention has been described in conjunction with specific limited embodiments, it is evident to those skilled in this art that many alternatives, modifications and variations will be apparent and appreciated in light of the foregoing description. For example, although the foregoing embodiments have been described in connection with semiconductors of the GaAs/GaAlAs regime, other light emitting materials may be employed, such as InGaAsP, GaAlP, GaAlSb and PbSnTe. Also, disordering is not limited to Zn diffusion, as other disordering species, e.g. Ge, Se, Mg, Sn, O, S, Be, Te, Si, Mn, Zn, Cd, Ln, Cr or Kr, as well as other disordering techniques, e.g. implant followed by anneal, are contemplated. Further, clad superlattices 20 and 50 are disclosed in FIGS. 1 and 3 formed in the top or p side cladding layer or region. Such a superlattice may likewise be formed in the bottom or n side cladding layer 14 or 44, respectively, either alone or in combination with p side clad superlattice 50. In this instance, and with reference to FIG. 3, cladding layer 44 would be the same refractive index profile as cladding layer 48 and the structure of the n side superlattice may be like that illustrated for p side superlattice 50. Accordingly, this invention is intended to embrace all such alternatives, modifications and variations as fall within the spirit and scope of the appended claims.

What is claimed:

1. In a clad superlattice semiconductor laser comprising a plurality of planar semiconductor layers, one or more of said layers forming an active region for light wave generation and propagation under lasing conditions in a confined optical cavity which includes said active region, a cladding layer formed on opposite sides of said active region, a superlattice formed as part of at least one of said cladding layers and comprising alternating layers of wells and barriers, the improvement comprising a pair of spatially separated disordered regions formed in said superlattice along adjacent sides of said optical cavity via impurity induced disordering, the depth of said regions not extending into said active region, the disordering of said regions providing said regions with a resultant lower refractive index compared to the refractive index of said optical cavity region to form a refractive index waveguide in said laser.

2. In a clad superlattice semiconductor laser comprising a plurality of planar semiconductor layers, one or more of said layers forming an active region for light wave generation and propagation under lasing conditions in a confined optical cavity which includes said active region, a cladding layer formed on opposite sides of said active region, a superlattice formed as part of at least one of said cladding layers and comprising alternating layers of wells and barriers, the improvement comprising a pair of spatially separated disordered regions formed in said superlattice along adjacent sides of said optical cavity via impurity induced disordering, the disordering of said regions providing said regions with a resultant lower refractive index compared to the refractive index of said optical cavity region to form a refractive index waveguide in said laser, and a cladding layer formed between said active region and said superlattice, the strength of optical coupling between said active region and said superlattice varied by altering the thickness and/or composition of said cladding layer.

3. The clad superlattice semiconductor of claim 1 wherein said impurity induced disordering is accomplished by diffusion.

4. The clad superlattice semiconductor laser of claim 1 wherein said impurity induced disordering is accomplished by implant followed by an anneal.

5. The clad superlattice semiconductor laser of claim 1 wherein current confinement means is formed in said laser.

6. The clad superlattice semiconductor laser of claim 5 wherein said current confinement means comprises a proton implant.

7. The clad superlattice semiconductor laser of any one of claims 1, and 2 through 6 wherein said superlattice is formed between adjacent cladding layers on one side and said active region.

8. The clad superlattice semiconductor laser of any one of claims 1, and 2 through 6 wherein said active region is a single active layer.

9. The clad superlattice semiconductor laser of any one of claims 1, and 2 through 6 wherein said active region is a single quantum well.

10. The clad superlattice semiconductor laser of any one of claims 1, and 2 through 6 wherein said active region is a multiple quantum well.

11. The clad superlattice semiconductor laser of claim 1 wherein said laser includes two superlattices, each superlattice included as part of a cladding layer on opposite sides of said active region, a pair of spatially separated disordered regions formed in said superlattice along adjacent sides of said optical cavity via impurity induced disordering, the depth of said regions not extending into said active region, the disordering of said regions providing said regions with a resultant lower refractive index compared to the refractive index of said optical cavity region to form a refractive index waveguide in said laser.

12. The clad superlattice semiconductor laser of claim 11 wherein a cladding layer is formed between said active region and each of said superlattices, the strength of optical coupling between said active region and each of said superlattices varied by altering the thickness and composition of said cladding layers.

13. The clad superlattice semiconductor laser of claim 11 wherein said impurity induced disordering is accomplished by diffusion.

14. The clad superlattice semiconductor laser of claim 11 wherein said impurity induced disordering is accomplished by implant followed by an anneal.

15. The clad superlattice semiconductor laser of claim 11 wherein current confinement means is formed in said laser.

16. The clad superlattice semiconductor laser of claim 15 wherein said current confinement means comprises a proton implant.

17. The clad superlattice semiconductor laser of any one of claims 11 through 16 wherein said superlattice is formed between adjacent cladding layers on one side of said active region.

18. The clad superlattice semiconductor laser of any one of claims 11 through 16 wherein said active region is a single active layer.

19. The clad superlattice semiconductor laser of any one of claims 11 through 16 wherein said active region is a single quantum well.

20. The clad superlattice semiconductor laser of any one of claims 11 through 16 wherein said active region is a multiple quantum well.

* * * * *